United States Patent
Larner et al.

[11] Patent Number: 6,104,638
[45] Date of Patent: Aug. 15, 2000

[54] USE OF ERASABLE NON-VOLATILE MEMORY FOR STORAGE OF CHANGING INFORMATION

[75] Inventors: Joel B Larner, Fort Collins; Michael J O'Brien, Loveland, both of Colo.

[73] Assignee: Hewlett-Packard Company, Palo Alto, Calif.

[21] Appl. No.: 09/258,582

[22] Filed: Feb. 26, 1999

[51] Int. Cl.$^7$ .................................................. G11C 16/04
[52] U.S. Cl. .............................. 365/185.33; 365/185.04; 365/52
[58] Field of Search ...................... 365/185.33, 218, 365/52, 49, 189.29, 185.04

[56] References Cited

U.S. PATENT DOCUMENTS

| | | | |
|---|---|---|---|
| 4,752,871 | 6/1988 | Sparks et al. | 364/200 |
| 4,931,997 | 6/1990 | Mitsuishi et al. | 365/218 |
| 5,200,959 | 4/1993 | Gross et al. | 371/21.6 |
| 5,210,854 | 5/1993 | Beaverton et al. | 395/500 |
| 5,303,198 | 4/1994 | Adachi et al. | 365/218 |
| 5,566,335 | 10/1996 | Nash et al. | 395/700 |
| 5,596,738 | 1/1997 | Pope | 395/430 |
| 5,630,093 | 5/1997 | Holzhammer et al. | 395/442 |

*Primary Examiner*—David Nelms
*Assistant Examiner*—Thong Le
*Attorney, Agent, or Firm*—Augustus W. Winfield

[57] ABSTRACT

Non-volatile write-once memory, is used for storage of variable data. In an example embodiment, segmented flash memory is used, in which individual segments can be erased. At least two segments are used. When a segment is nearly full, or when the segment is corrupted, the latest values are written to a new segment. During initialization, all variables of interest are written into RAM with default values. The flash segment being used is read sequentially from oldest entry to newest entry, and values from flash memory are used to overwrite values (or pointers to values) in RAM. RAM then contains (or points to) the most recent value for every variable. When a new segment is written, the new segment is written using the values from RAM. The method provides for identification of the latest (current) value for each stored item of information, provides for adding new types of data and deleting old types of data, provides for action when a memory segment is full, and provides for recovery from power-failure.

4 Claims, 5 Drawing Sheets

USE OF ERASABLE NON-VOLATILE MEMORY FOR STORAGE OF CHANGING INFORMATION

FIELD OF INVENTION

This invention relates generally to computer processor based systems, and more specifically to non-volatile storage of changing information.

BACKGROUND OF THE INVENTION

Computer systems commonly store data in random access memory (RAM). Memory locations in RAM can be rapidly overwritten. RAM is typically volatile, meaning that all information is lost when power is removed. Historically, non-changing software (called firmware) for computer processor based systems was often stored in non-volatile, non-erasable, read-only memory (ROM). If the software needed to be changed, ROMs were replaced. More recently, various programmable or erasable non-volatile memory technologies have been developed. Typically, erasable non-volatile memory devices do not have to be removed for firmware updates. Examples include programmable read only memory (PROM), and electrically erasable programmable read only memory (EEPROM), also called flash memory. Flash memory chips may be electronically erased, and each erased memory location can be written once. To change the contents of a memory location, the entire chip (or in some versions, a large segment or block of the chip) must be erased, and the contents must then be rewritten.

Some information changes over time and needs to be saved in non-volatile memory. For example, an electromechanical computer peripheral system may need to track the number of hours the unit has been powered on, for preventive maintenance. A common approach is to update the power-on data every hour. The power-on information must be saved in non-volatile memory. One common approach is to save such data in low power static RAM, with a battery to retain power to the static RAM when system power is off. This approach is relatively expensive, and reliability depends on the integrity of the battery charge and the power switch over circuitry.

There is an ongoing need for non-volatile storage of changing data.

SUMMARY OF THE INVENTION

Non-volatile, write-once memory is used for storage of variable data. In an example embodiment, segmented flash memory is used, in which individual segments can be erased. At least two segments are used. When a segment is nearly full, or when the segment is corrupted, the latest values are written to a new segment. During initialization, all variables of interest are written into RAM with default values. The flash segment being used is read sequentially from oldest entry to newest entry, and values from flash memory are used to overwrite values (or pointers to values) in RAM. RAM then contains (or points to) the most recent value for every variable. When a new segment is written, the new segment is written using the values from RAM. The method provides for identification of the latest (current) value for each stored item of information, provides for adding new types of data and deleting old types of data, provides for action when a memory segment is full, and provides for recovery from power-failure.

DETAILED DESCRIPTION OF THE PREFERRED EMBODIMENT OF THE INVENTION

Figure 1:
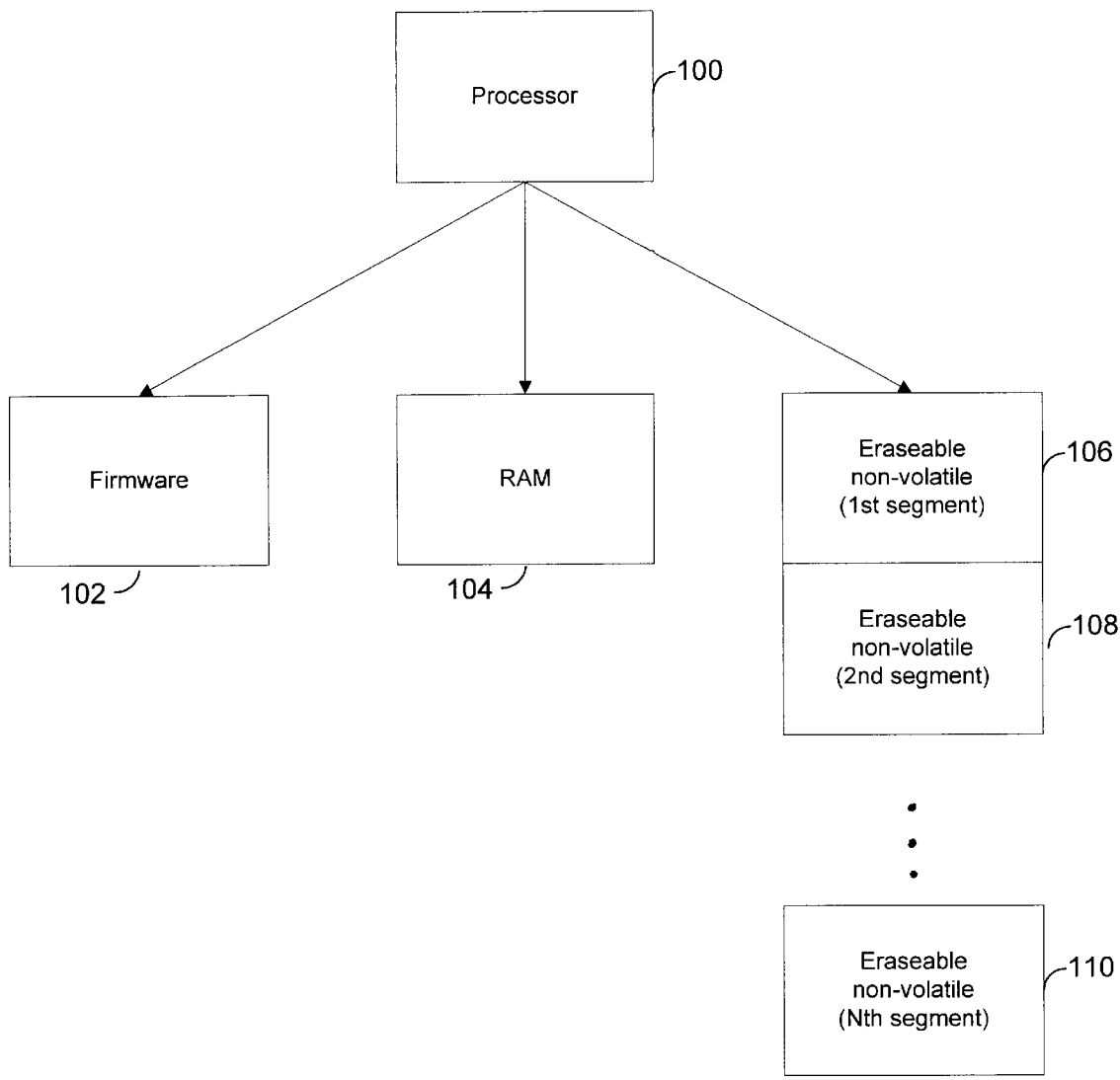
FIG. 1 is a block diagram of a processor based system in accordance with the invention.

FIG. 1 is a block diagram of a processor based system in accordance with the invention. A processor 100 is controlled by firmware 102, which may be in ROM. The system also uses volatile RAM 104. In addition, the system uses non-volatile memory (106, 108, and 110). In a specific example embodiment of the invention, segmented (or blocked) flash memory is used, in which each location can be written only once, but an entire segment or block can be erased. That is, the smallest portion that can be erased is segment 106, or segment 108, or segment 110. Other types of erasable, non-volatile, write-once memory may be equally suitable. In the following discussion, the expression "the erased value" means whatever value is stored in a memory location in a non-volatile segment after erasure. In a specific example embodiment, when non-volatile segments are erased, each memory location is set to FFFF hex.

Use of erasable, write-once, segmented memory for storage of changing parameters requires a solution to the following problems:

Identification of the latest (current) value for each stored item of information;

Provision for adding new types of data, and deleting old types of data;

Provision for action when a memory segment is full;

Provision for power-failure, to ensure that no data is lost if power is lost during transfer of data from one memory segment to another or during writing of data.

The invention solves each of the above problems and provides additional features as discussed below.

In the example embodiment, for convenience of memory management, each item of information to be stored is packaged in a data structure called a parameter, where a parameter comprises identification of the data, length of the data, and the actual data. In the example embodiment, each parameter includes a parameter ID. The parameter ID identifies the item of information, and specifies the length of the item of information. The identified data immediately follows the parameter ID in memory. In the specific example embodiment, the parameter ID is one 16-bit word, and the two most significant bits of the parameter ID specify one of three ID classes as follows:

00 16-bit data field;

01 32-bit data field;

10 Variable length data field (next word specifies length).

In a specific example application of the invention, the invention is used in a mass-memory drive mechanism having a removable storage medium. Examples of data of interest for storing in non-volatile memory include drive serial number (determined at manufacturing time), date of manufacture, the number of hours the drive has been powered-on, the number of times a medium has been loaded into the drive (load count), and the amount of data read or written over the life of the drive (read counter). These types of data are useful for maintenance and for preventive maintenance. After the drive has been used for a while, the segment of non-volatile memory being used to store the relevant parameters may appear as in the following example:

---

Parameter ID for drive serial number, variable length data field.
Length of data field for drive serial number (3 words).
Data (first 16 bits of drive serial number).
Data (second 16 bits of drive serial number).
Data (third 16 bits of drive serial number).
Parameter ID for date of manufacture, 16-bit data field.
Data (date of manufacture).
Parameter ID for power-on hours, 16-bit data field
Data (power-on-hours/10)
Parameter ID for load count, 32-bit data field
Data (first 16 bits of load count data)
Data (second 16 bits of load count data)
Parameter ID for read count, 32-bit data field
Data (first 16 bits of read count data)
Data (second 16 bits of read count data)
Parameter ID for load count, 32-bit data field
Data (first 16 bits of load count data)
Data (second 16 bits of load count data)
Parameter ID for read count, 32-bit data field
Data (first 16 bits of read count data)
Data (second 16 bits of read count data)
Unwritten location (erased value)
Unwritten location (erased value)
Unwritten location (erased value)

---

In the above example, the load-count and read-count parameters have been updated with newer information since they were first written to the non-volatile memory segment. In the example embodiment, the parameters to be stored are coded into the firmware. During initialization, the firmware creates an entry in volatile RAM for every parameter of interest and assigns a default value to each parameter. The firmware then reads the non-volatile memory segment from the beginning, reading the value for each parameter and overwriting the value in RAM. If a subsequent value of any parameter is found, the previous value in RAM is replaced. By performing this progressive walk through the non-volatile memory segment, the final resulting information in RAM is the most recent value for every parameter. In the specific example embodiment, the erased value of FFFF hex is not valid for a parameter ID, so that when the initialization firmware encounters a value of FFFF where a parameter ID is expected, the firmware knows that it has reached the end of the recorded information.

Preferably, the firmware reserves known locations in RAM for each parameter. The firmware then can reference a fixed known location for each data item, as would normally be done by a variable reference in compiled code. In addition, this provides quick read access to a parameter because there is no need for a reference look-up to find the current location of each parameter. However, if saving space in RAM is preferable, a pointer to the most recent location in non-volatile memory may be stored in RAM. Access is then slower, but this may be acceptable for infrequently changing parameters or parameters that have a large length that would consume significant amounts of RAM. The data structure in volatile RAM may be identical to the data structure in non-volatile memory, or the data structure in RAM may be different. The only requirement is that the firmware must know the RAM location for every parameter of interest. This could be done by direct compiled reference, or an embodiment of a lookup/hash table.

As updated parameter values are appended in the non-volatile memory segment, the segment will eventually fill. In the example embodiment of the invention, when one segment is full (or when a predetermined threshold is reached, or when a segment becomes corrupted due to power failure during a parameter update operation), the most recent values for the parameters, as stored in RAM, are copied to an unused non-volatile memory segment. The previously used segment may then be erased. The system may reserve two segments for changing parameters, and alternate between the two segments. Alternatively, the system may use other segment selection algorithms, the only requirement being that one unused segment must be available to copy into from volatile RAM.

After walking consecutively through the non-volatile memory segment, each parameter in volatile RAM has its latest value (either the default value or its latest value from the non-volatile memory). Each time a parameter is updated, or each time a new segment is written, the parameter with its latest value is written into non-volatile memory. Similarly, if a parameter is deleted in a new version of the firmware, the firmware does not assign a RAM location for the deleted parameter, and the parameter is not copied from non-volatile memory to volatile RAM. When a new non-volatile segment is written, the deleted parameter is not written to the new non-volatile segment. As a result, if the firmware is updated, and new parameters are added or deleted, they are automatically added to the parameters or deleted from the parameters in non-volatile memory.

The original segment is not erased until a new segment is written. If power is lost during writing of a new segment, the new segment may be left in a corrupt state. Accordingly, if two segments contain parameter data during initialization, the system must have a method for determining which of two segments is valid and current. Likewise, if power is lost while a value is being written into non-volatile memory, the segment may be left in a corrupt state. A method in accordance with the invention provides for recovery from power loss during writing of a parameter into non-volatile memory, and provides for recovery from power loss during writing of a new segment, as illustrated in FIGS. 2A–2D.

Figure 2A:
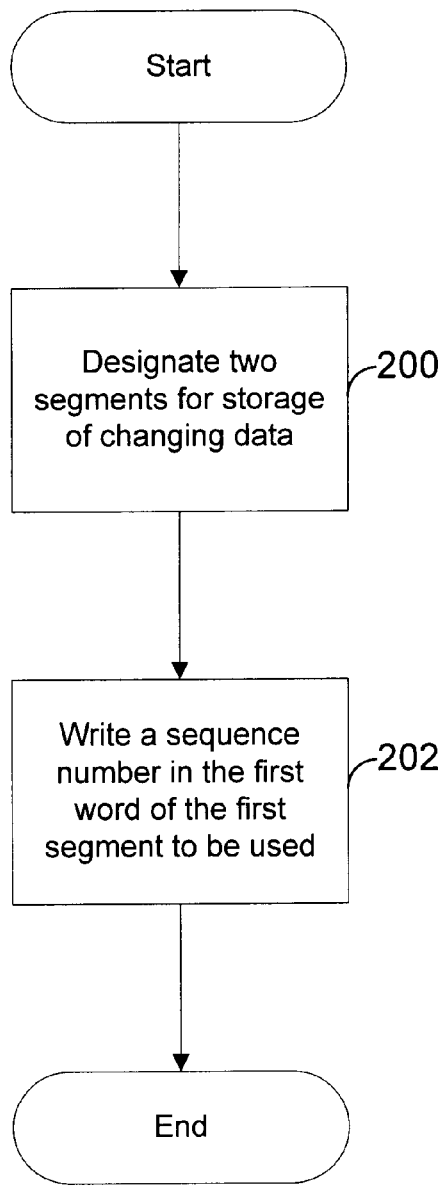
FIG. 2A is a first part of a flow chart of a method in accordance with the invention, illustrating setting initial conditions.

FIGS. 2A–2D are flow charts of a method of using erasable non-volatile memory to store changing data in accordance with the invention. FIG. 2A illustrates setup of initial conditions, which may occur during manufacturing or may occur the first time the system is started. At step 200, two segments are designated for use in non-volatile storage of changing data. A first segment will be used until filled, and then the second segment will be used. Two segments may be dedicated to non-volatile storage of changing data (with the system switching back and forth between the two), or other algorithms may be used to identify at least two segments that may be used. Both segments should be initially erased. At step 202, a sequence number is written into the first word of the first segment to be used. As will be discussed further below, each time a new segment is used, the sequence number is incremented and written as the first word of the new segment.

Figure 2B:
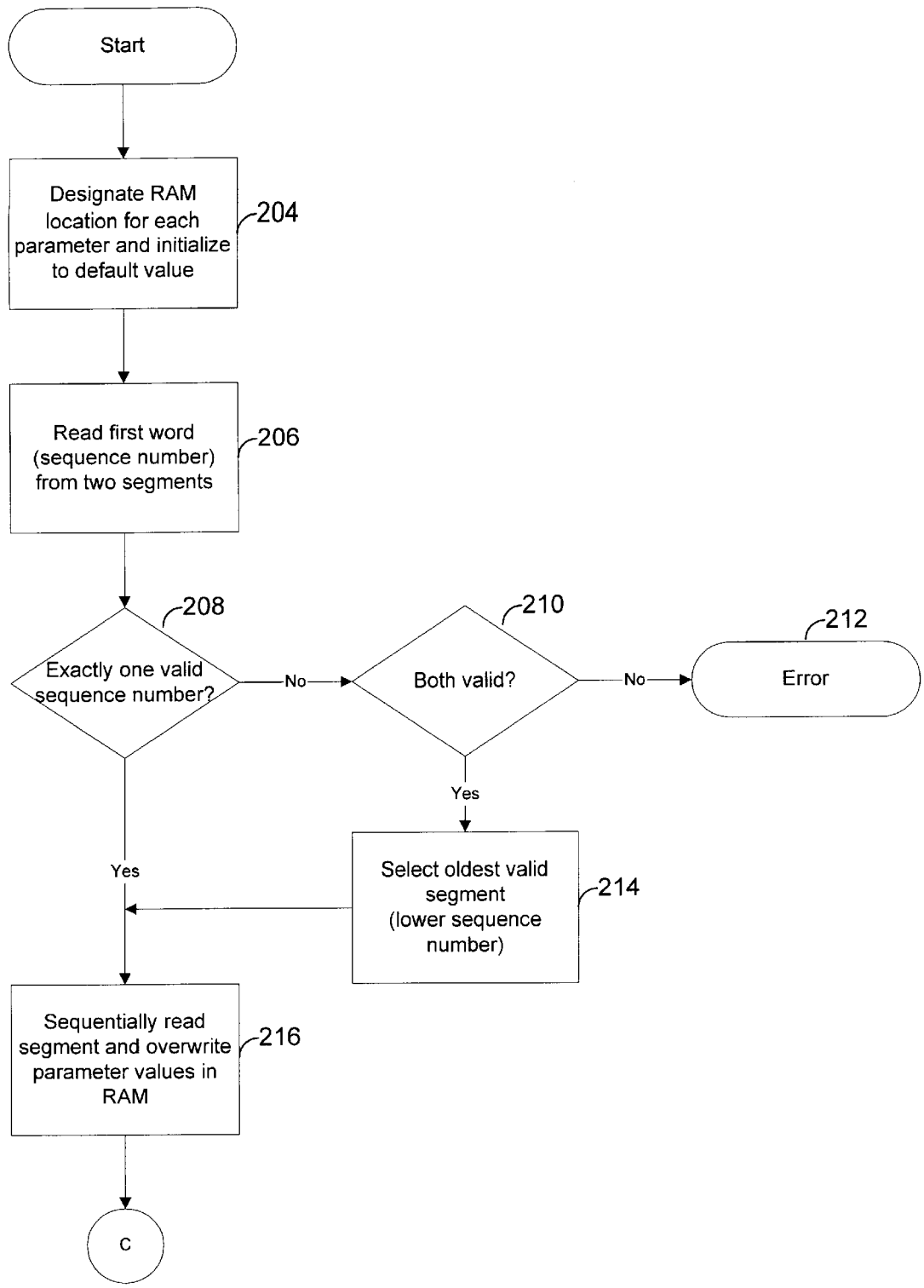
FIG. 2B is a second part of flow chart of a method in accordance with the invention, illustrating copying of data from non-volatile memory to RAM.

FIG. 2B illustrates part of an initialization process for the processor, which is executed when system power is applied, or after a hard reset. At step 204, the firmware designates RAM locations for every parameter of interest, and writes a default value in RAM for each parameter having a value in RAM (for some variable length parameters, RAM may contain a pointer to a location in non-volatile memory). At step 206, the first word of each of the designated segments is read, and test 208 determines whether exactly one segment contains a sequence number (whether only one segment has a value in the first word that is not equal to the erased value). If the first word of both segments is the erased value (test 210), then an error condition has occurred (step 212). If both segments contain a sequence number (the first word of each segment is not the erased value), then power may have been lost during writing of one of the segments. At step 214, the segment with the lowest sequence number is selected, which assumes that the segment having the lowest sequence number still has valid data, and assumes that the other segment is corrupted. At step 216, parameters are sequentially read from the segment currently being used, and values in RAM are overwritten.

Figure 2C:
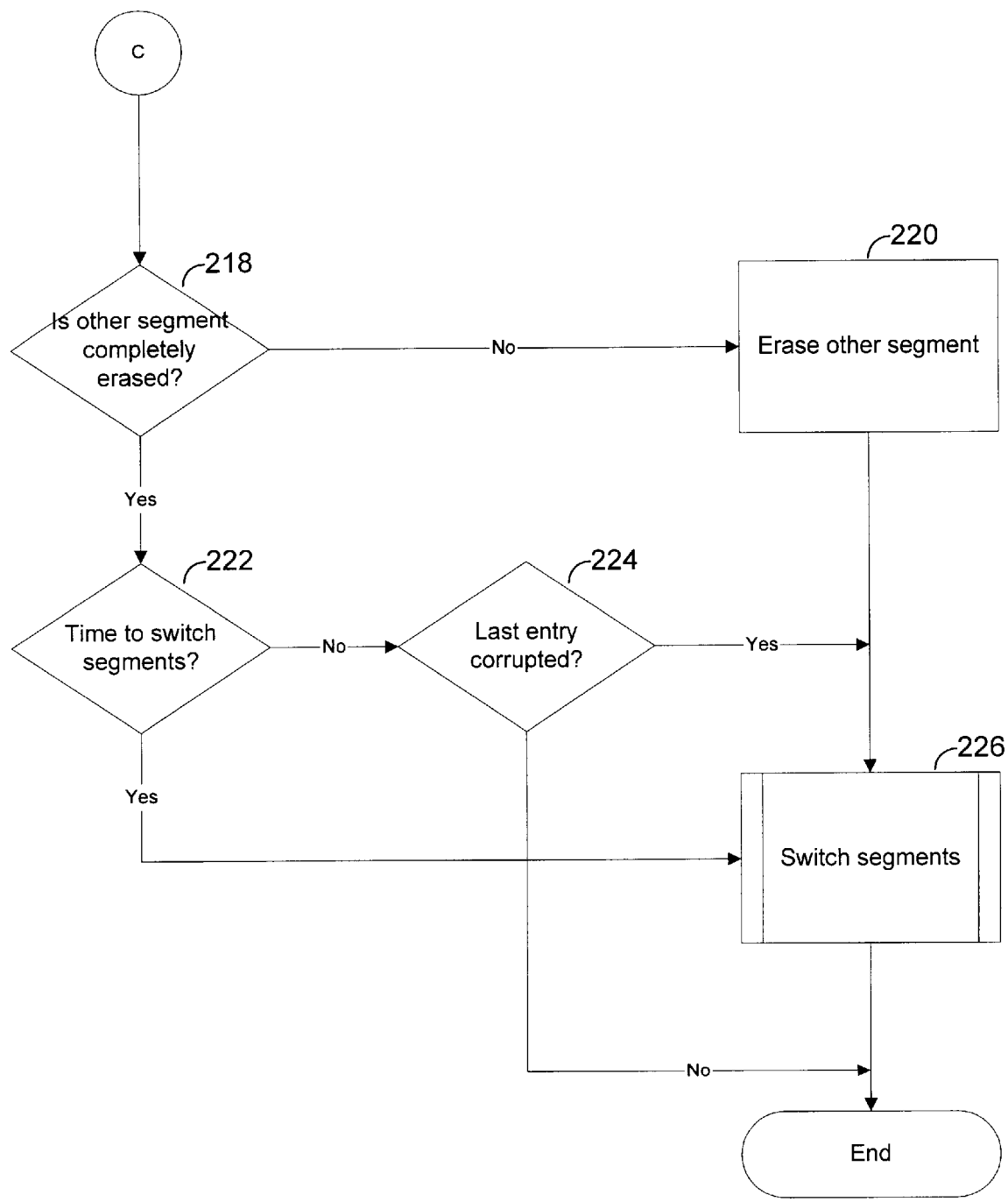
FIG. 2C is a flow chart continuation of FIG. 2B, illustrating switching segments.

In FIG. 2C, at decision 218, if the segment that is not being used is not erased (the first word is not the erased value), then it is assumed that the segment was being written earlier, and power was lost during writing. Accordingly, the segment is erased (step 220), and the process of switching segments is started again (step 226). At decision 222, if a segment is almost full, then the process of switching segments is started (step 226). The test at decision 222 may be a predetermined threshold, such as a percentage of the segment has been used, or it may simply be determined that there is no room to store another parameter.

When parameters are stored in non-volatile memory, the value is stored first, and then the parameter ID is stored. As a result, if power is lost while a parameter is being stored, then the location for the parameter ID will have the erased value, and there will be data other than the erased value stored beyond the location of the parameter ID. At test 224, locations beyond the first erased value are checked to see if they are also equal to the erased value. If not, power may have been lost during writing of the last parameter. If there are locations beyond the first erased value that are not equal to the erased value, then the segment is corrupted.

That is, without a segment ID, there is no way to determine the expected length or validity of the data. Therefore, a new segment is written (step 226), with last known values for all parameters.

Figure 2D:
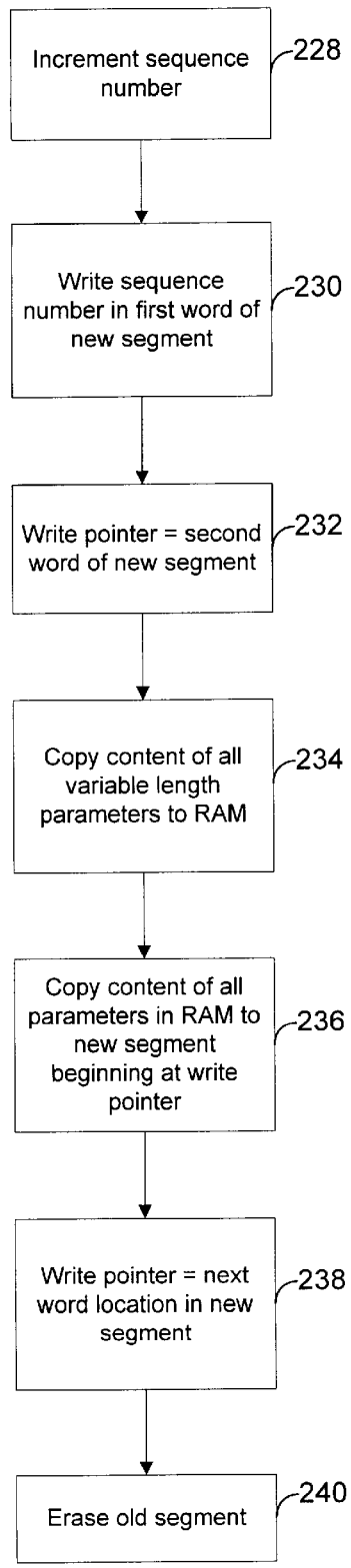
FIG. 2D is flow chart providing additional detail for block 226 of FIG. 2C.

FIG. 2D is an expansion of step 226 (FIG. 2C), in which segments are switched. At step 228, the sequence number is incremented. At step 230, the new sequence number is written into the first word of the new segment. At step 232, a write pointer is set to point to the second word of the segment. In the specific example embodiment, the erasable non-volatile memory being used can be placed into either a read mode, or a write mode, but not both at the same time. If variable length parameters are not copied into RAM, reading variable length data from non-volatile memory and then writing variable length data back int would require switching the memory back and forth between a read mode and a write mode. Accordingly, at step 234, all parameters that are not normally copied in RAM are then copied to RAM. At step 236, all parameters in RAM are copied into the new segment. At step 238, the write pointer is positioned to write a new parameter value. After step 238, it is safe to erase the old segment, and this is done at step 240.

It is possible that sequence numbers may wrap from FFFF hex to 0000 hex. FFFF is an invalid sequence number since it is the erased value. Therefore, FFFF and 0000 are special cases that must be checked when incrementing and writing the sequence number (FIG. 2D, steps 228 and 230) and when selecting the oldest of two segments (FIG. 2B, step 214).

Still another consideration is whether all of a segment is useable. During manufacturing test, it may be determined that one or more memory locations in non-volatile memory are defective. Alternatively, during the lifetime of the product, one or more memory locations within a segment may fail. A partially working segment may still be useable. One can simply write until a defective location is reached, or one can start writing beyond the last defective location, or one can map around the defective location(s). One parameter that is stored in non-volatile memory may be a map of known defective locations for specific segments. Writing to a segment, reading from a segment, and the decision as to when to switch segments, must all then take into account the parameter that identifies defective locations. For an example of defect handling for flash memory, see U.S. Pat. No. 5,200,959.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for saving data in a non-volatile memory that is erasable but not over-writable, the method comprising the following steps:

(a) defining a location in a volatile memory for the data;

(b) when the data changes, overwriting the data in the volatile memory and writing a new version of the data in a first portion of the non-volatile memory;

(c) determining whether the first portion of the non-volatile memory is almost full; and (d) when it is determined that the first portion of the non-volatile memory is almost full, copying the data from the volatile memory to a second portion of the non-volatile memory.

2. The method of claim 1, further comprising the following steps after step (a):

(a1) writing a default value at the location defined in volatile memory for the data;

(a2) reading the data from the non-volatile memory; and (a3) overwriting the default value in volatile memory with the data read from non-volatile memory.

3. The method of claim 1, further comprising the following steps after step (a):

(a1) determining that two portions of the non-volatile memory may both contain the data; and (a2) determining that one of the two portions identified in step (a1) was written to first, and designating the portion written to first as a first portion for use in step (b).

4. The method of claim 1, step (b) further comprising the following step:

writing an identification, corresponding to the data, in the first portion of the non-volatile memory, after writing the data in the first portion of the non-volatile memory.

\* \* \* \* \*